United States Patent
Tsan et al.

(10) Patent No.: US 6,407,007 B1
(45) Date of Patent: Jun. 18, 2002

(54) METHOD TO SOLVE THE DELAMINATION OF A SILICON NITRIDE LAYER FROM AN UNDERLYING SPIN ON GLASS LAYER

(75) Inventors: Chun-Ching Tsan, Touliu; Ying-Lang Wang, Taichung; Hui-Ling Wang, Hsin-Chu; Chin Kun Lan, Taichung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/193,669

(22) Filed: Nov. 17, 1998

(51) Int. Cl.⁷ .................................. H01L 21/324
(52) U.S. Cl. ........................... 438/763; 438/798
(58) Field of Search ................ 438/787, 790, 438/798, 624, 761, 763

(56) References Cited

U.S. PATENT DOCUMENTS

| | | | |
|---|---|---|---|
| 5,314,839 A | | 5/1994 | Mizutani et al. ............ 437/173 |
| 5,554,567 A | | 9/1996 | Wang ........................ 437/195 |
| 5,556,806 A | | 9/1996 | Pan et al. .................. 437/195 |
| 5,567,658 A | * | 10/1996 | Wang et al. ............... 438/697 |
| 5,643,407 A | | 7/1997 | Chang ..................... 156/644.1 |
| 5,650,359 A | * | 7/1997 | Ahlburn .................... 438/790 |
| 5,665,849 A | * | 9/1997 | Cho .......................... 528/31 |
| 5,861,345 A | * | 1/1999 | Chou et al. ................ 438/787 |
| 5,989,983 A | * | 11/1999 | Goo et al. .................. 438/798 |
| 6,143,670 A | * | 11/2000 | Cheng et al. ............... 438/780 |
| 6,153,512 A | * | 11/2000 | Chang et al. .............. 438/624 |
| 6,184,123 B1 | * | 2/2001 | Ge et al. .................... 438/624 |

OTHER PUBLICATIONS

Wolf et al., Silicon Processing for the VLSI Era vol. 1, Lattice Press, 1986, p. 191.*
Djennas F. et al., Investigation of Plasma Effects on Plastic Packages Delamination and Cracking. 1993, IEEE, pp. 919–924.*

* cited by examiner

*Primary Examiner*—Olik Chaudhuri
*Assistant Examiner*—Anh Duy Mai
(74) *Attorney, Agent, or Firm*—George O. Saile; Stephen B. Ackerman

(57) ABSTRACT

A method for improving the adhesion of a thick silicon nitride layer, to an underlying spin on glass, (SOG), layer, has been developed. After applying, baking and curing of a SOG layer, plasma treatment of the SOG layer, is performed in a deposition tool, using a nitrous oxide plasma. The plasma treatment prepares the exposed SOG surface for an in situ deposition of a thick silicon nitride layer, by improving the adhesion of thick silicon nitride to the underlying SOG layer, and by decreasing the possibility of silicon nitride delamination, that can occur with counterparts, fabricated without the nitrous oxide plasma treatment of the SOG layer.

18 Claims, 2 Drawing Sheets

METHOD TO SOLVE THE DELAMINATION OF A SILICON NITRIDE LAYER FROM AN UNDERLYING SPIN ON GLASS LAYER

BACKGROUND OF THE INVENTION (1) Field of the Invention

This invention relates to a method used to fabricate a semiconductor device, and more specifically to a method used to form passivating insulator layers on underlying metal interconnect structures.

(2) Description of Prior Art

The trend in the semiconductor industry has been to continually increase device performance, while still maintaining or decreasing the cost of semiconductor devices. These objectives have been partially satisfied by micro-miniaturazation, or the ability to produce semiconductor devices with sub-micron features. Advances in the photo-lithographic discipline, in terms of more sophisticated exposure cameras, as well as the development of more sensitive photoresist materials have allowed sub-micron images in photoresist to be routinely achieved. In addition similar advances in the dry etching discipline has allowed the sub-micron images in photoresist to be successfully defined, in underlying materials that are used in the fabrication of semiconductor chips.

The use of sub-micron features however, can however create new problem areas that have to be addressed by the semiconductor engineering community. For example when using a technology with a minimum feature of 0.25 um, the use of sub-micron metal interconnects, with sub-micron spaces between metal interconnects, has created a problem in terms of using standard dielectric passivation processes, used to successfully insulate specific metal interconnects. To satisfy the conductivity, as well as the reliability requirements, in terms of current density for electromigration resistance, the narrower metal interconnects have to be thicker. This together with the narrower spaces, now used between metal lines, result in aspect ratios that conventional insulator deposition processes have difficulty in successfully filling. However the use of spin on glass, (SOG), layers, have been successful in passivating the thicker, narrow metal interconnects structures, in terms of the ability of the SOG layer to fill the narrow spaces between the metal interconnect structures. The SOG layer, applied via a technology similar to photoresist application, results in a planar top surface, featuring a thick SOG, in the narrow spaces between metal structures, while a thinner SOG layer is formed on the top surface of the narrow metal interconnect structures.

To successfully complete the passivation of underlying conductive elements, of a sub-micron semiconductor device, a thick silicon nitride layer is used, overlying the SOG layer. However the adhesion of the thick silicon nitride layer, on an underlying SOG layer, can be marginal, sometimes resulting in deleterious delamination of the thick silicon nitride layer. This invention will offer a solution to the unwanted phenomena of silicon nitride delamination, from underlying SOG layers. This is accomplished via use of a novel nitrous oxide anneal procedure, performed in situ, prior to the deposition of the thick silicon nitride layer. Prior art, such as Pan et al, in U.S. Pat. No. 5,556,806, offers an oxygen plasma treatment of a SOG layer, prior to deposition of overlying layers, while Chang, in U.S. Pat. No. 5,643,407, describes a method of subjecting a via hole, formed in a SOG, layer, to a nitrogen plasma treatment, prior to filling the via hole with metal. However these prior arts do not describe the in situ, nitrous oxide procedure, offered in this invention, applied to an underlying SOG layer, prior to deposition of a thick silicon nitride layer.

SUMMARY OF THE INVENTION

It is an object of this invention to use a SOG layer to passivate underlying metal interconnect structures, and to fill the narrow spaces between metal interconnect structures.

It is another object of this invention to use a thick silicon nitride layer on the underlying SOG layer.

It is yet another object of this invention to perform a plasma anneal treatment of the underlying SOG layer, in a nitrous oxide plasma, prior to the in situ deposition of an overlying, thick silicon nitride layer.

In accordance with the present invention a method is described for forming a silicon nitride layer on a SOG layer, where the SOG layer is located on, and in the narrow spaces between, metal interconnect structures, and featuring the use of a plasma nitrous oxide anneal procedure, prior to the in situ deposition of the silicon nitride layer. After formation of the metal interconnect structures, on an underlying, first insulator layer, and with the metal interconnect structures communicating with underlying conductive elements, through via holes in the first insulator layer, exposing the underlying conductive elements, a second insulator layer is conformally deposited on the metal interconnect structures, and in the spaces between metal interconnect structures, however not filling the spaces between the metal interconnect structures. A spin on glass, (SOG), layer is next applied, completely filling the spaces between the metal interconnect structures, and resulting in a planar top surface topography. A plasma, nitrous oxide treatment is next applied to the exposed planar SOG surface, followed by an in situ deposition of a thick silicon nitride layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming a thick silicon nitride layer, on an underlying SOG layer, using a pre-deposition, plasma nitrous oxide treatment, applied to the underlying SOG layer, prior to silicon nitride deposition, used to prevent the delamination of the thick silicon nitride layer, will now be described in detail. The SOG layer described in this invention is used to passivate metal interconnect structures that can be lower metal interconnect structures, used to communicate with conductive regions in a semiconductor substrate, via contact holes to the conductive regions in the semiconductor substrate, or the SOG layer can be used to passivate metal interconnect structures, used to communicate with underlying levels of metal interconnect structures, with contact to the underlying metal interconnect structures through metal filled via holes.

Figure 1:
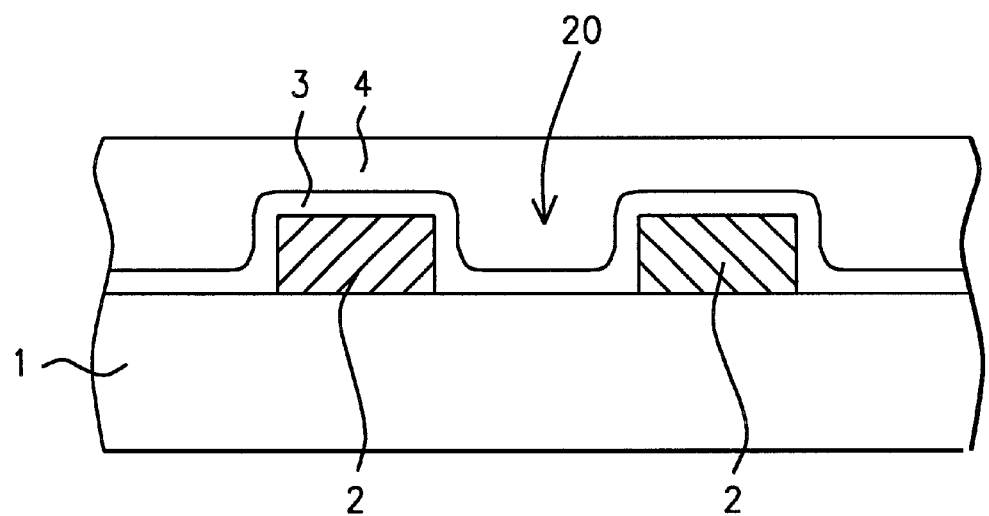
FIGS. 1, 3, and 4, which schematically, in cross-sectional style, show a thick silicon nitride layer, formed on an underlying SOG layer, using a pre-deposition, plasma nitrous oxide treatment, to prevent silicon nitride delamination.

FIG. 1, schematically shows a first insulator layer 1, comprised of silicon oxide, where first insulator layer 1, either overlays a pattern of underlying metal interconnect structures, or first insulator 1, is overlying a semiconductor substrate. Metal interconnect structures 2, located on first insulator layer 1, are formed from a metal interconnect layer such as an aluminum based layer, at a thickness between about 4000 to 10000 Angstroms, containing between about 0.5 to 1.0 weight % copper, or from a tungsten layer, obtained via plasma vapor deposition, (PVD), or from a chemical vapor deposition procedure, (CVD), to a thickness between about 3000 to 6000 Angstroms. Conventional photolithographic and anisotropic reactive ion etching, (RIE), procedures, using $Cl_2$ or $SF_6$ as an etchant, are used to create metal interconnect structures 2, shown schematically in FIG. 1. Although not shown in FIG. 1, metal interconnect structures 2, contact underlying conductive regions, such as conductive, or diffused regions in a semiconductor substrate, or metal interconnect structures 2, contact lower level, underlying metal interconnect structures, using metal filled contact, or via holes, formed in first insulator layer 1. After removal of the photoresist shape, used to define metal interconnect structures 2, via plasma oxygen ashing and careful wet cleans, second insulator layer 3, is deposited, conformally covering metal interconnect structures 2. Second insulator layer 3, schematically shown in FIG. 1, obtained using plasma enhanced chemical vapor deposition, (PECVD), procedures, at a thickness between about 1000 to 2000 Angstroms, can be a silicon oxide layer, or a silicon oxynitride layer.

The narrow spaces 20, between metal interconnect structures 2, between about 400 to 1000 Angstroms, in addition to the height of metal interconnect structures 2, can be difficult to adequately fill with insulator layers using either PVD or CVD procedures, and therefore the procedure to spin on a glass layer, is chosen. SOG layer 4, shown schematically in FIG. 1, is comprised with silicate or siloxane, suspended in a solvent, and applied via a spin on procedure, uniformly spreading over the topography created by the metal interconnect structures. SOG layer 4, applied at a thickness between about 3000 to 6500 Angstroms, partially, or completely fills narrow spaces 20, while resulting in a SOG layer with a planar, and with a smooth top surface topography. SOG layer 4, is then baked at a temperature between about 100 to 250° C., using a hot plate, followed by a curing treatment, at a temperature between about 350 to 450° C., for purposes of removing volatile components.

Figure 2:
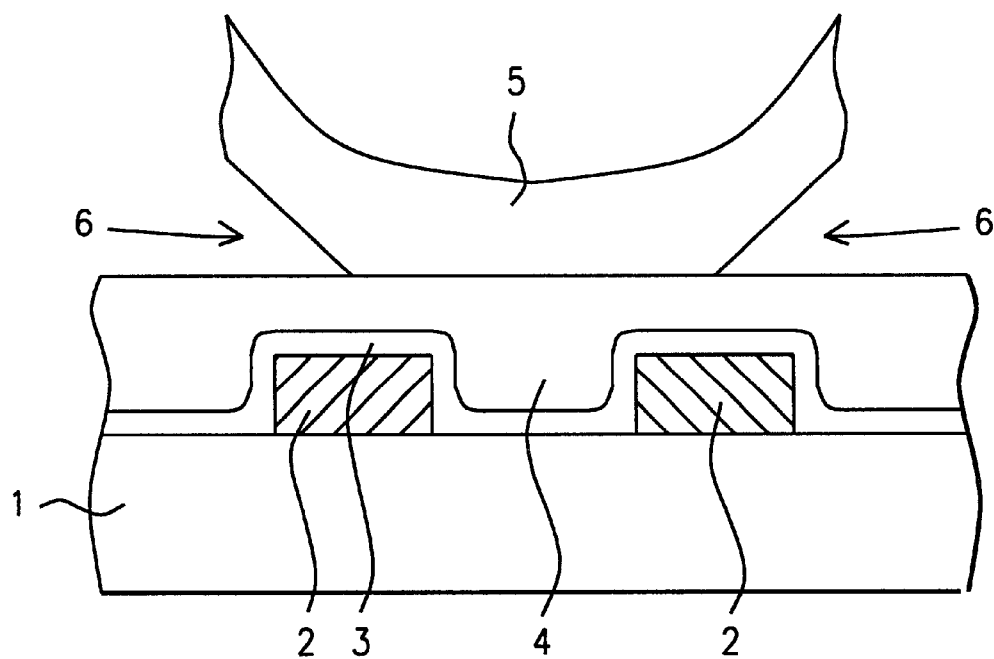
FIG. 2, which schematically, in cross-sectional form, shows the delamination of a thick silicon nitride layer, from the surface of an underlying SOG layer, where the thick silicon nitride layer was deposited without a pre-deposition, plasma nitrous oxide treatment.

For purposes of completing the passivation of the semiconductor chip, after the formation of a top level of metal interconnect structures, or after formation of intermediate levels of metal interconnect structures, a thick silicon nitride layer is employed. The ability of silicon nitride to protect underlying elements from the environment, result in the use of this material, for this situation. However the stress encountered with thick silicon nitride layers, can lead to delamination of this layer from the smooth top surface of SOG layer 4. FIG. 2, schematically shows silicon nitride layer 5, obtained via PECVD procedures, at a temperature between about 390 to 410° C., at a thickness between about 8000 to 12000 Angstroms, overlying SOG layer 4. The thickness of silicon nitride layer 5, again between about 8000 to 12000 Angstroms, is needed to insure protection of underlying materials and structures, from subsequent processes, or from the environment. However the thickness of silicon nitride layer 5, including the related stress inherent in silicon nitride, can result in delamination of silicon nitride layer 5, from the smooth top surface of SOG layer 4, at interface 6. This is schematically shown in FIG. 2.

Figure 3:
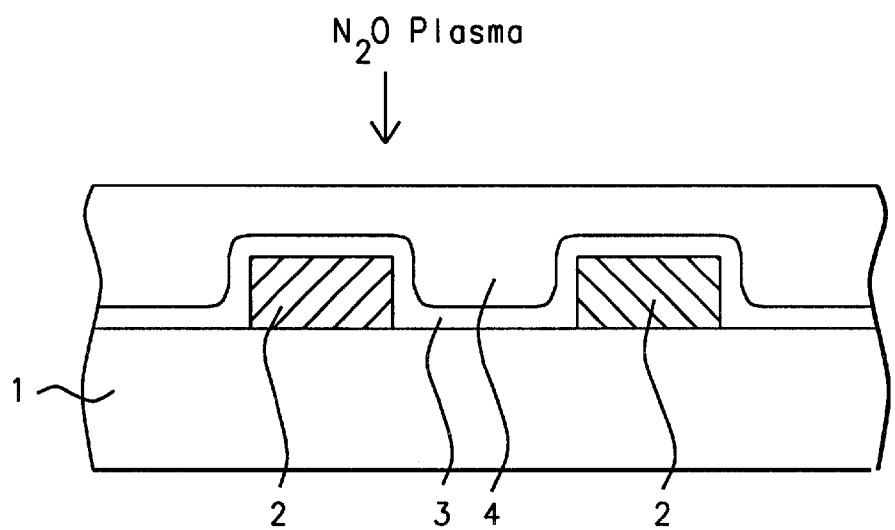
Figure 4:
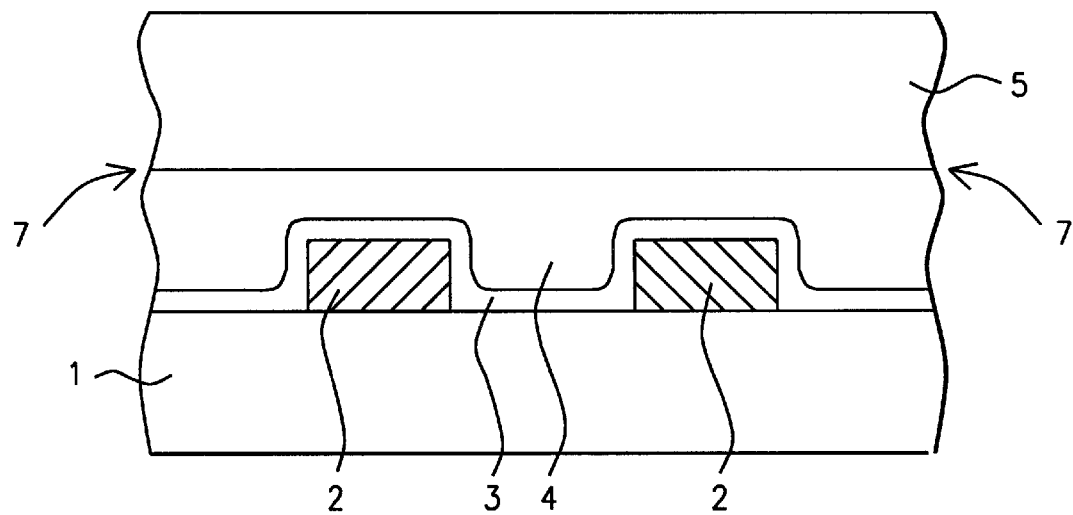

The method of using a thick silicon nitride layer, on an underlying SOG layer, without delamination of the silicon nitride layer, will now be described, and schematically shown in FIGS. 3–4. A semiconductor substrate, with an exposed SOG layer 4, is placed in the tool used for silicon nitride deposition, but is first subjected to a nitrous oxide, ($N_2O$), treatment. The plasma treatment of SOG layer 4, is performed at a temperature between about 390 to 410° C., for a time between about 20 to 60 sec., at a pressure between about 4.5 to 5.0 torr, at an R.F. power between about 175 to 225 watts, using between about 1300 to 1500 sccm of nitrous oxide. This treatment, shown schematically in FIG. 3, roughens the top surface of SOG layer 4, allowing an in situ deposition of silicon nitride layer 5, again deposited via PECVD procedures, at a temperature between about 390 to 410° C., and at a thickness between about 8000 to 12000 Angstroms, to adhere to underlying SOG layer 4, without delamination at interface 7. This is schematically shown in FIG. 4.

While this invention has been particularly shown and described with reference to, the preferred embodiments thereof, it will be understood by those skilled in the art that various changes in form and details may be made without departing from the spirit and scope of this invention.

What is claimed is:

1. A method for forming a thick insulator layer on an underlying, spin on glass, (SOG), layer, with said SOG layer featuring a planar, smooth top surface topography, on a semiconductor substrate, comprising the steps of:

forming metal interconnect structures, on an underlying first insulator layer;

depositing a second insulator layer on said metal interconnect structures, and in the spaces between said metal interconnect structures;

applying said SOG layer, on said second insulator layer completely filling the spaces between said metal interconnect structures, and resulting in said SOG layer featuring said planar, smooth top surface topography;

baking of said SOG layer;

curing of said SOG layer;

performing a plasma treatment, in a nitrogen containing ambient,for a time between about 20 to 60 sec, resulting in said SOG layer comprised with a planar, roughened top surface topography; and depositing said thick insulator layer, comprised of silicon nitride at a thickness between about 8000 to 12000 Angstroms, on plasma treated, said planar, roughened top surface topography, of said SOG layer.

2. The method of claim 1, wherein said first insulator layer is a silicon oxide layer.

3. The method of claim 1, wherein said metal interconnect structures are comprised of an aluminum based metal layer, containing between about 0.5 to 1.0 weight percent copper, obtained via plasma vapor deposition procedures, at a thickness between about 4000 to 10000 Angstroms.

4. The method of claim 1, wherein said metal interconnect structures are comprised of tungsten, obtained via plasma vapor deposition, or via chemical vapor deposition procedures, at a thickness between about 3000 to 6000 Angstroms.

5. The method of claim 1, wherein the spaces between said metal interconnect structures are between about 400 to 1000 Angstroms.

6. The method of claim 1, wherein said second insulator layer is a silicon oxynitride layer, or a silicon oxide layer, deposited using PECVD procedures, to a thickness between about 1000 to 2000 Angstroms.

7. The method of claim 1, wherein said SOG layer is applied to a thickness between about 3000 to 6500 Angstroms.

8. The method of claim 1, wherein said spin on glass layer is baked at a temperature between about 100 to 250° C., and than cured at a temperature between about 350 to 450° C.

9. The method of claim 1, wherein said plasma treatment is performed in a deposition tool, in a nitrous oxide ambient, at a temperature between about 390 to 410° C., for a time between about 20 to 60 sec., at a pressure between about 4.5 to 5.0 mtorr, at an R.F. power between about 175 to 225 watts, and with a nitrous oxide flow between about 1300 to 1500 sccm.

10. A method for improving the adhesion of a thick silicon nitride layer, to an underlying spin on glass, (SOG), layer, comprised with a planar, smooth top surface topography, on a semiconductor substrate, via use of a nitrous oxide plasma treatment, applied to said SOG layer, prior to the deposition of said thick silicon nitride layer, comprising the steps of:

providing a silicon oxide layer, with openings in said silicon oxide layer, exposing the top surface of underlying conductive elements;

forming metal interconnect structures, on said silicon oxide layer, and on the top surface of said conductive elements, exposed in said openings in said silicon oxide layer;

depositing a silicon oxynitride layer on said metal interconnect structures, and on regions of said silicon oxide layer, not covered by said metal interconnect structures;

applying said SOG layer on said silicon oxynitride, and completely filling spaces between said metal interconnect structures, resulting in said SOG layer featuring said planar, smooth top surface topography;

baking of said SOG layer;

curing of said SOG layer;

performing said nitrous oxide plasma treatment, in a deposition tool, for a time between about 20 to 60 sec, resulting in a planar, roughened top surface topography for said SOG layer; and depositing said thick silicon nitride layer, at a thickness between about 8000 to 12000 Angstroms, in situ, in said deposition tool, on plasma treated, said SOG layer, comprised with said planar, roughened top surface topography.

11. The method of claim 10, wherein said underlying conductive elements, exposed at the bottom of openings in said silicon oxide layer are lower level, metal interconnect structures, or diffused regions in said semiconductor substrate.

12. The method of claim 10, wherein said metal interconnect structures are comprised of an aluminum based layer, containing between about 0.5 to 1.0 weight percent copper, obtained via plasma vapor deposition procedures, at a thickness between about 4000 to 10000 Angstroms.

13. The method of claim 10, wherein said metal interconnect structures are comprised of tungsten, obtained via plasma vapor deposition, or chemical vapor deposition procedures, at a thickness between about 3000 to 6000 Angstroms.

14. The method of claim 10, wherein said spaces, between said metal interconnect structures, are between about 400 to 1000 Angstroms.

15. The method of claim 10, wherein said silicon oxynitride layer is deposited using PECVD procedures, at a thickness between about 1000 to 2000 Angstroms.

16. The method of claim 10, wherein said SOG layer is applied at a thickness between about 3000 to 6500 Angstroms.

17. The method of claim 10, wherein said SOG layer is baked at a temperature between about 100 to 250° C., and than cured at a temperature between about 350 to 450° C.

18. The method of claim 10, wherein said nitrous oxide plasma treatment, is performed at a temperature between about 390 to 410° C., at a pressure between about 4.5 to 5.0 mtorr, for a time between about 20 to 60 sec, using an R.F. power between about 175 to 225 watts, and using a nitrous oxide flow between about 1300 to 1500 sccm.

* * * * *